(12) United States Patent
Prechtl et al.

(10) Patent No.: US 10,388,736 B2
(45) Date of Patent: Aug. 20, 2019

(54) METHODS OF FORMING SUBSTRATE STRUCTURES AND SEMICONDUCTOR COMPONENTS

(71) Applicant: Infineon Technologies Austria AG, Villach (AT)

(72) Inventors: Gerhard Prechtl, Rosegg (AT); Horst Schäfer, Landsberg am Lech (DE); Oliver Häberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/695,526

(22) Filed: Sep. 5, 2017

(65) Prior Publication Data

US 2018/0047813 A1    Feb. 15, 2018

Related U.S. Application Data

(62) Division of application No. 15/073,366, filed on Mar. 17, 2016, now Pat. No. 9,768,258.

(51) Int. Cl.
| | |
|---|---|
| *H01L 29/778* | (2006.01) |
| *H01L 29/15* | (2006.01) |
| *H01L 21/02* | (2006.01) |
| *H01L 29/20* | (2006.01) |
| *H01L 29/207* | (2006.01) |
| *H01L 33/12* | (2010.01) |
| *H01L 33/32* | (2010.01) |
| *H01L 29/10* | (2006.01) |

(52) U.S. Cl.
CPC ........ *H01L 29/154* (2013.01); *H01L 21/0254* (2013.01); *H01L 21/02458* (2013.01); *H01L 21/02507* (2013.01); *H01L 21/02579* (2013.01); *H01L 29/2003* (2013.01); *H01L 29/207* (2013.01); *H01L 29/7783* (2013.01); *H01L 29/7784* (2013.01); *H01L 29/7786* (2013.01); *H01L 29/1066* (2013.01); *H01L 33/12* (2013.01); *H01L 33/32* (2013.01)

(58) Field of Classification Search
CPC ......... H01L 21/02458; H01L 21/02507; H01L 21/8252; H01L 21/8254; H01L 29/6631; H01L 29/66318; H01L 29/778; H01L 29/7781; H01L 29/7782; H01L 29/7783; H01L 29/7784

See application file for complete search history.

(56) References Cited

U.S. PATENT DOCUMENTS

| | | | |
|---|---|---|---|
| 8,410,472 B2 | 4/2013 | Ikuta et al. | |
| 8,742,459 B2 | 6/2014 | Mishra et al. | |
| 2006/0281238 A1 | 12/2006 | Harris et al. | |
| 2010/0289067 A1* | 11/2010 | Mishra | H01L 29/2003 257/268 |
| 2016/0254378 A1* | 9/2016 | Inoue | H01L 21/02507 257/20 |

* cited by examiner

*Primary Examiner* — Cuong Q Nguyen
(74) *Attorney, Agent, or Firm* — Murphy, Bilak & Homiller, PLLC

(57) ABSTRACT

In an embodiment, a method includes forming an intentionally doped superlattice laminate on a support substrate, forming a Group III nitride-based device having a heterojunction on the superlattice laminate layer, and forming a charge blocking layer between the heterojunction and the superlattice laminate.

20 Claims, 5 Drawing Sheets

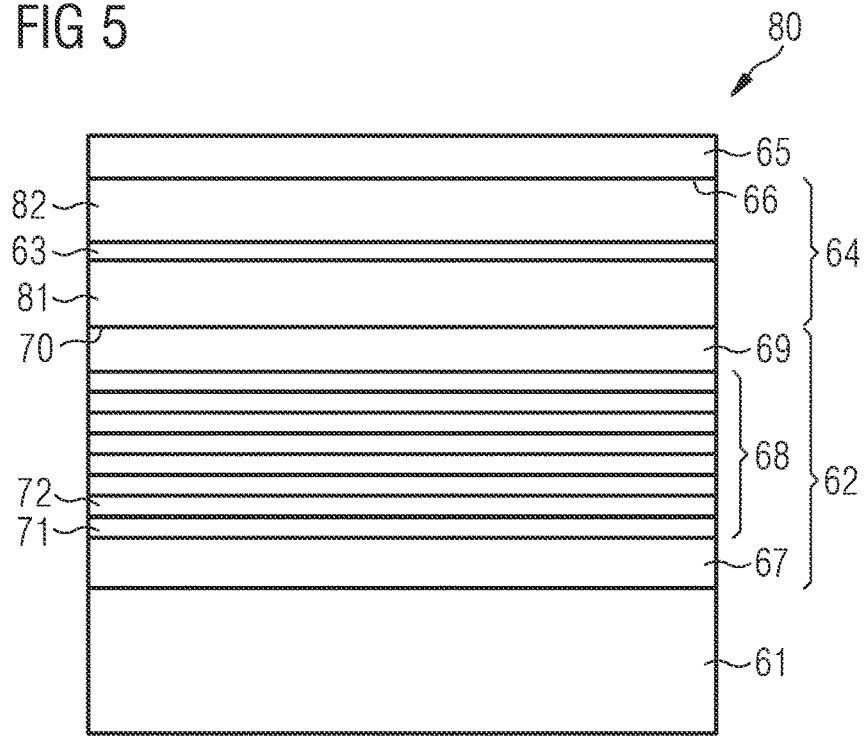
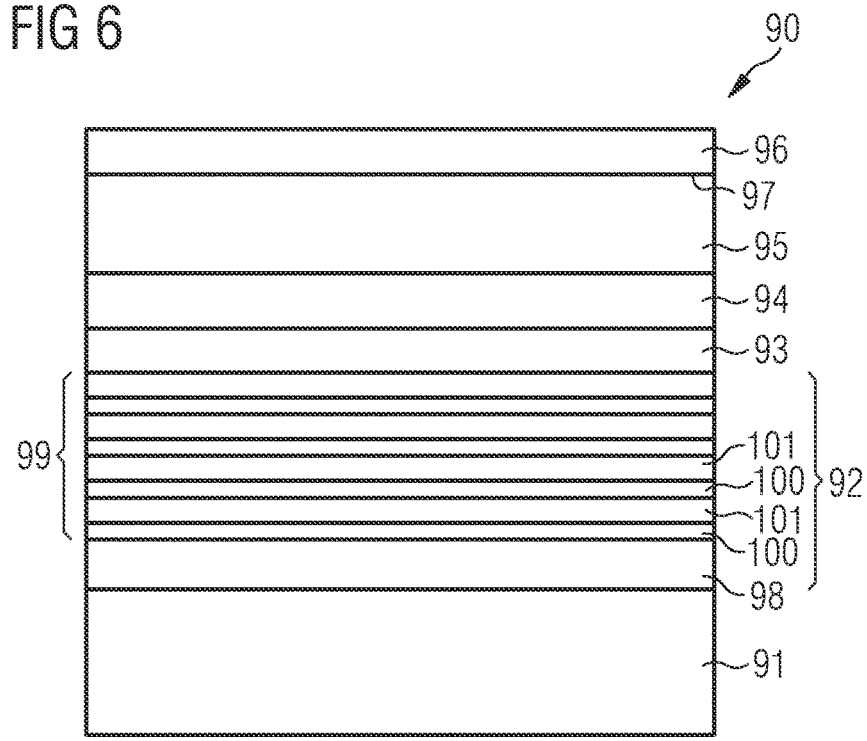

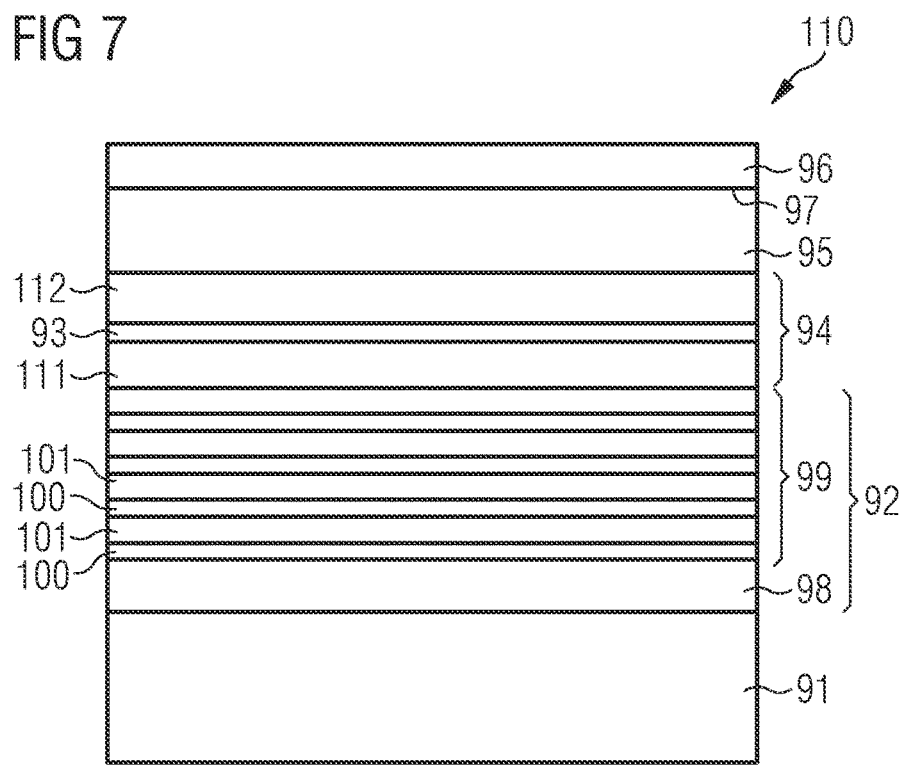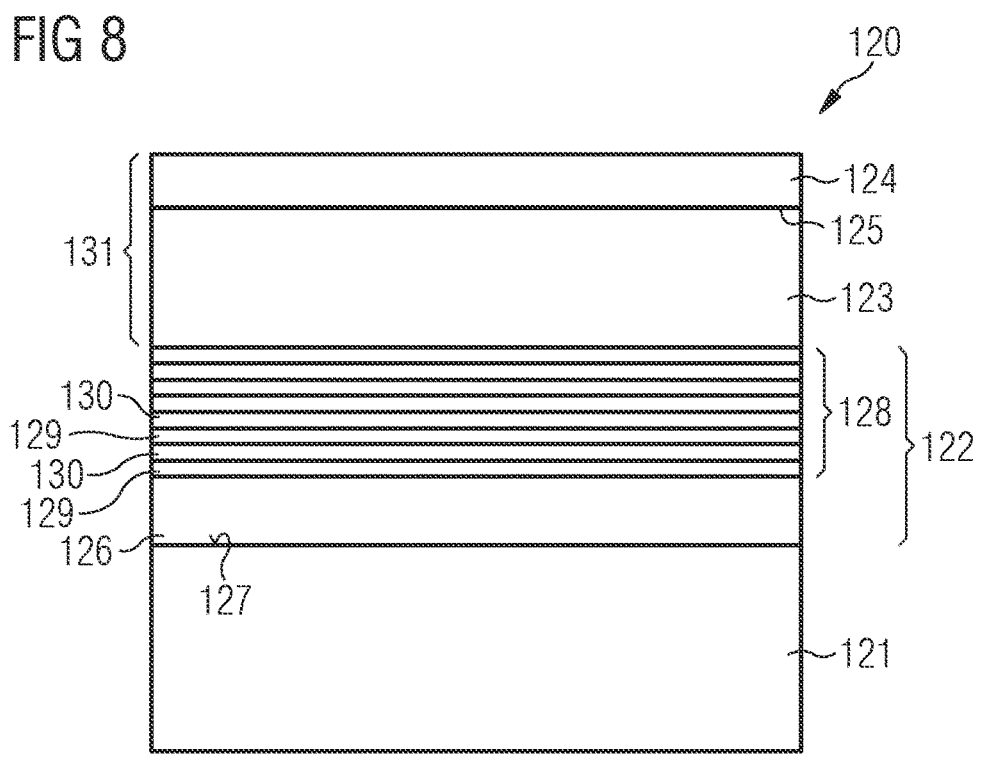

METHODS OF FORMING SUBSTRATE STRUCTURES AND SEMICONDUCTOR COMPONENTS

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a substrate structure includes a support substrate, a buffer structure arranged on the support substrate, the buffer structure including an intentionally doped superlattice laminate, an unintentionally doped first Group III nitride layer arranged on the buffer structure, a second Group III nitride layer arranged on the first Group III nitride layer forming a heterojunction therebetween, and a blocking layer arranged between the heterojunction and the buffer structure. The blocking layer is configured to block charges from entering the buffer structure.

In an embodiment, a semiconductor component includes a transistor device including a support substrate, a buffer structure arranged on the support substrate, the buffer structure including an intentionally doped superlattice laminate, an unintentionally doped first Group III nitride layer arranged on the buffer structure, a second Group III nitride layer arranged on the first Group III nitride layer forming a heterojunction therebetween, a source, a drain and a gate arranged on the second Group III nitride layer, and a blocking layer arranged between the heterojunction and the buffer structure. The blocking layer is configured to block charges from entering the buffer structure.

In an embodiment, a substrate structure includes a support substrate, a superlattice laminate arranged on the support substrate, the superlattice laminate having a dopant concentration of at least $10^{18}/cm^3$, a first Group III nitride layer arranged on the superlattice laminate and a second Group III nitride layer arranged on the first Group III nitride layer forming a heterojunction therebetween. The first Group III nitride layer and the second Group III nitride layer have a dopant concentration of less than $10^{18}/cm^3$.

In an embodiment, a method includes forming an intentionally doped superlattice laminate on a support substrate, forming a Group III nitride-based device including a heterojunction on the superlattice laminate layer and inserting a charge blocking layer between the heterojunction and the superlattice laminate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 5 illustrates a substrate structure according to a fifth embodiment.

FIG. 6 illustrates a substrate structure according to a sixth embodiment.

FIG. 7 illustrates a substrate structure according to a seventh embodiment.

FIG. 8 illustrates a substrate structure according to an eighth embodiment.

DETAILED DESCRIPTION

Figure 1:
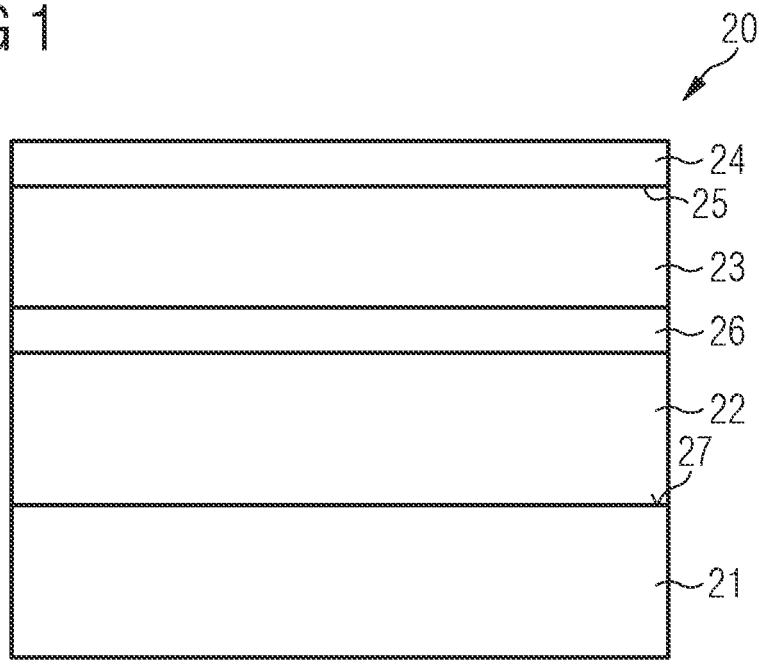
FIG. 1 illustrates a substrate structure according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

FIG. 1 illustrates a substrate structure 20 according to a first embodiment. The substrate structure 20 includes a support substrate 21, a buffer structure 22 arranged on the support substrate 21, a first Group III nitride layer 23 arranged on the buffer structure 22, a second Group III nitride layer 24 arranged on the first Group III nitride layer 23 forming a heterojunction 25 between the first Group III nitride layer 23 and the second Group III nitride layer 24. The substrate structure 20 also includes a blocking layer 26 which is arranged between the heterojunction 25 and the buffer structure 22. The blocking layer 26 is configured to block charges from entering the buffer structure 22.

The buffer structure 22 is intentionally doped and may include an intentionally doped superlattice laminate. The term "intentionally doped" is used herein to describe a dopant concentration of at least $10^{18}/cm^3$. In some embodiments, the dopant concentration lies in the range of $10^{18}/cm^3$ to $10^{20}/cm^3$. In an embodiment, the buffer structure 22, in particular the superlattice laminate, is carbon doped. However, in other embodiments, the dopant is iron.

The first Group III nitride layer 23 and the second Group III nitride layer 24 are unintentionally doped. As used herein, the term "unintentionally doped" refers to a layer to which no dopants have been intentionally added and which has a dopant or defect concentration of less than $10^{18}/cm^3$.

Since a heterojunction 25 is formed between the first Group III nitride layer 23 and the second Group III nitride layer 24, the first Group III nitride layer 23 and the second Group III nitride layer 24 include materials having differing bandgaps. In an embodiment, the first Group III nitride layer 23 includes gallium nitride (GaN) and the second Group III nitride layer 24 includes aluminium gallium nitride ($Al_xGa_{(1-x)}N$), where $0<x<1$.

The heterojunction 25 formed between the first Group III nitride layer 23 and the second Group III nitride layer 24 may be used in a device structure, such as a transistor device, to support a conductive layer including charges. In some embodiments, in which the device structure is a High Electron Mobility Transistor (HEMT), a two-dimensional electron gas (2DEG) is formed by piezoelectric and spontaneous polarization at the heterojunction 25 which provides the conductive layer.

In the embodiment illustrated in FIG. 1, the blocking layer 26 is unintentionally doped and is arranged between, and is in direct contact with, the first Group III nitride layer 23 and the buffer structure 22.

The blocking layer 26 may be configured to block or prevent charges, such as charges formed at the heterojunction 25 formed between the first Group III nitride layer 23 and the second Group III nitride layer 24, from entering the buffer structure 22, in particular, during device operation.

The blocking layer 26 may have a different bandgap from the bandgap of the first Group III nitride layer 23 in order to provide a discontinuity in the valence band structure or in the conduction band structure. For example, if the first Group III nitride layer 23 includes gallium nitride, the blocking layer 26 may include aluminium gallium nitride.

The support substrate 21 includes a surface 27 which is capable of supporting the epitaxial growth of Group III nitrides. The support substrate 21 may include a single crystal wafer such as silicon, silicon carbide or sapphire. The support substrate 21 may be provided by a silicon wafer such as a silicon wafer having a <111> orientation. The buffer structure 22 includes one or more Group III nitride layers, which are epitaxially grown on the support substrate 21. The first Group III nitride layer 23 and the second Group III nitride layer 24 are also epitaxially grown on the support substrate 21 and may provide the active portion of the substrate structure 20 used in a semiconductor device.

The buffer structure 22 is arranged between the support substrate 21 and the first Group III nitride layer 23 in order to reduce the lattice mismatch between the crystal structure of the surface of the support substrate 21 and the crystal structure of the first Group III nitride layer 23. The buffer structure 22 may also provide compensation for differing thermal expansion coefficients.

For a transistor device such as a High Electron Mobility Transistor (HEMT), defects in the first Group III nitride layer 23 may result in vertical and lateral leakage currents. These leakage currents may be reduced by intentionally doping the buffer structure 22 with carbon, for example. However, the carbon doping is thought to introduce trap centres which may be responsible for a dynamic $R_{DSON}$ effect, current collapse and threshold voltage shifts. The combination of a doped buffer structure 22 and the insertion of a blocking layer 26 between the heterojunction 25 and the buffer structure 22 may be used to produce a substrate structure 20 which when used in a transistor device results in reasonable blocking conditions and improved dynamic $R_{DSON}$ suppression.

If the charges are electrons, the blocking layer 26 may be configured to produce a discontinuity in the conduction band. If the charges are holes, the blocking layer 26 may be configured to produce a discontinuity in the valence band. In both cases, the discontinuity should result in a larger bandgap with respect to the first Group III nitride layer 23.

In some embodiments, the buffer structure 22 includes a superlattice laminate which is intentionally doped. The superlattice laminate may include sublayers of differing composition to provide a periodically varying bandgap. In some embodiments, the superlattice laminate includes alternate first layers and second layers, wherein the first layer includes $B_{a1}Al_{b1}Ga_{c1}In_{d1}N$ material, wherein $0 \leq a_1 \leq 1$, $0 \leq b_1 \leq 1$, $0 \leq c_1 \leq 1$, $0 \leq d_1 \leq 1$ and $(a_1+b_1+c_1+d_2)=1$ and the second layer includes $B_{a2}Al_{b2}Ga_{c2}In_{d2}N$ material, wherein $0 \leq a_2 \leq 1$, $0 \leq b_2 \leq 1$, $0 \leq c_2 \leq 1$, $0 \leq d_2 \leq 1$ and $(a_2+b_2+c_2+d_2)=1$ and wherein the band gap of the second layer material is different from that of the first layer material.

In some embodiments, the first and second layers of the superlattice laminate include $Al_{b1}Ga_{c1}N$ and $Al_{b2}G_{c2}N$, whereby $b_1 > b_2$ and $c_1 < c_2$ and $(b_1+c_1)=1$ and $(b_2+c_2)=1$. In an embodiment, the first layer of the superlattice laminate is made of AlN and the second layer is made of $Al_{b2}Ga_{c2}N$, whereby $a_2=0$, $d_2=0$, $0<b_2<1$, $c_2<1$, and $(b_2+c_2)=1$. The superlattice laminate may include 50 to 100 layers in total. The first layers may each have a thickness of 1 nm to 15 nm and the second layers may each have a thickness of 5 nm to 30 nm.

The buffer structure 22 may include one or more further layers between the superlattice laminate and the support substrate 21, for example an aluminium nitride layer, and may include one or more further layers arranged on the opposing side of the superlattice laminate to the support substrate 21. These further layers, particularly the further layers arranged on the opposing side of superlattice laminate to the support substrate 21, may also be intentionally doped. The doping concentration may be the same as the superlattice laminate or may be different.

The substrate structure may be used as part of various devices including a Light Emitting Diode (LED) and a transistor device. In one particular embodiment, the substrate structure is used as part of a High Electron Mobility Transistor (HEMI).

The blocking layer 26 may be arranged at different positions within the stack between the buffer structure 22 and the heterojunction 25. In the embodiment illustrated in FIG. 1, the blocking layer 26 is in direct contact with both the buffer structure 22 and the first Group III nitride layer 23. The opposing interface of the first Group III nitride layer 23 forms the heterojunction 25 with the second Group III nitride layer 24. Therefore, the entire thickness of the first Group III nitride layer 23 is arranged between the heterojunction 25 and the blocking layer 26. The blocking layer 26 may be called a back barrier.

Figure 2:
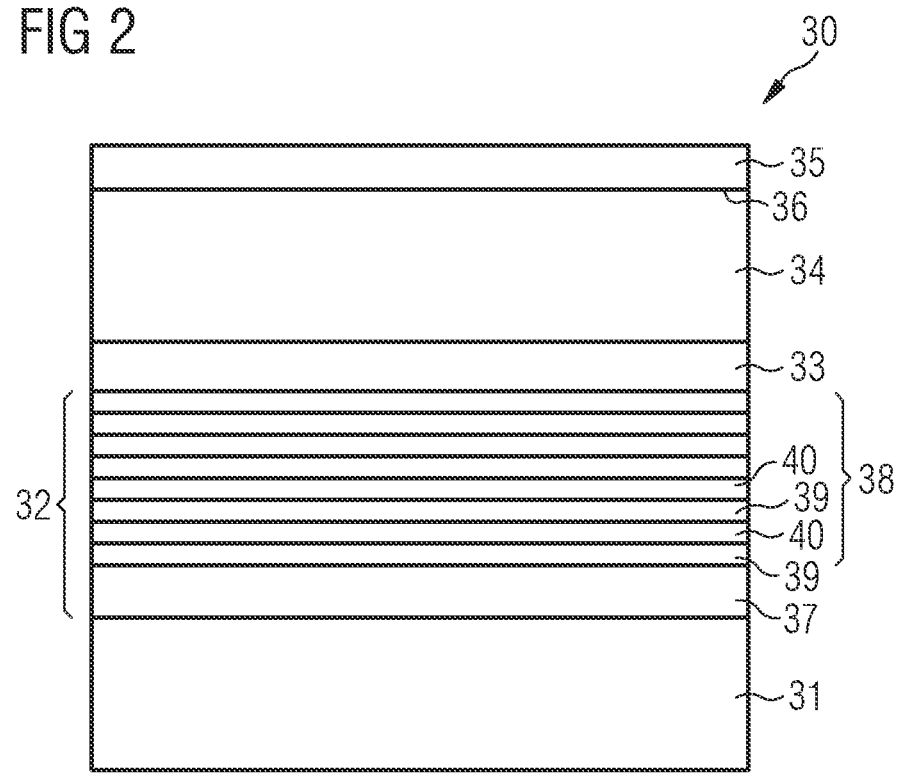
FIG. 2 illustrates a substrate structure according to a second embodiment.

FIG. 2 illustrates a schematic cross-sectional view of a substrate structure 30 according to a second embodiment, The substrate structure 30 includes a support substrate 31 in the form of a single crystal silicon wafer having an upper surface with a <111> orientation, a buffer structure 32 arranged on the support structure 31, a blocking layer 33 arranged on the buffer structure 32, a first unintentionally doped Group III nitride layer 34 arranged on the blocking layer 33 and a second unintentionally doped Group III nitride layer 35 arranged on the first unintentionally doped Group III nitride layer 34 which forms a heterojunction 36 between the second unintentionally doped Group III nitride layer 35 and the first unintentionally doped Group III nitride layer 34. The first unintentionally doped Group III nitride layer 34 may include gallium nitride and the second unintentionally doped Group III nitride layer 35 may include aluminium gallium nitride.

The buffer structure 32 and the blocking layer 33 may include Group III nitrides which along with the first Group III nitride layer 34 and the second Group III nitride layer 35 are grown on the support structure 31 such that each layer has an epitaxial relationship with the support substrate 31 and the other layers of the stacked structure.

In this embodiment, the buffer structure 32 includes an initially grown Group III nitride layer 37 and a superlattice laminate 38 which is intentionally doped. The initially grown layer 37 may be intentionally or unintentionally doped. The initially grown layer 37 may also include two or more sublayers and have a substantially constant or varying composition. The initially grown layer 37 may include aluminium nitride and be arranged between the superlattice laminate 38 and the support substrate 31. The blocking layer 33 is arranged between, and in direct contact with, the superlattice laminate 38 and the first unintentionally doped Group III nitride layer 34.

The superlattice laminate 38 includes alternating sublayers 39, 40 of Group III nitride material, whereby adjacent layers of the laminate have differing bandgaps. Both the first sublayers 39 and the second sublayers 40 are intentionally doped with carbon or iron such that the doping concentration is at least $10^{18}$ cm$^3$. The blocking layer 33 is unintentionally doped.

In some embodiments, the first sublayers 39 of the superlattice laminate include $Al_{b1}Ga_{c1}N$ and the second sublayers 40 include $Al_{b2}G_{c2}N$, whereby $b_1 > b_2$ and $c_1 < c_2$ and $(b_1+c_1)=1$ and $(b_2+c_2)=1$. In one embodiment, the first sublayers 39 of the superlattice laminate 38 include AlN and the second sublayers 40 include $Al_{b2}Ga_{c2}N$, whereby $0<b_2<1$, $0<c_2<1$ and $(b_2+c_2)=1$. The superlattice laminate 38 may include 50 to 100 layers in total. The first sublayers 39 may each have a thickness of 1 nm to 15 nm and the second sublayers 40 may each have a thickness of 5 nm to 30 nm.

The blocking layer 33 includes a material having a larger bandgap than that of the first Group III nitride layer 34 and may include aluminium gallium nitride, for example. The blocking layer 33 may be considered as a back barrier and may have a composition of $Al_xGa_{(1-x)}N$ with $0.03 \leq x \leq 0.1$ and a thickness of 200 nm $\leq t \leq$ 400 nm.

The substrate structure 30 may be used as part of a transistor device. The intentionally doped superlattice laminate 38 of the buffer structure 32 may be used to reduce leakage currents. However, the dopant may result in trap centres in which charges providing the conducting layer of the transistor may become trapped, thus increasing dynamic $R_{DSON}$ effects. By inserting the blocking layer 33 between the heterojunction 36 and the superlattice laminate 38 charges are prevented from being trapped in the trap centres in the superlattice structure 38 and the dynamic $R_{DSON}$ effects suppressed.

Additionally, due to the lattice mismatch between the <111> silicon wafer 31 and the Group III nitride layers forming the buffer structure 32, dislocations may be formed at the interface between the superlattice laminate 38 and the first unintentionally doped Group III nitride layer 34 which may also trap charges and form lateral current leakage paths. The use of the blocking layer 30 may also be used to reduce this lateral current leakage.

As discussed above, the blocking layer may be arranged at various positions within the stack of Group III nitride layers between the heterojunction and the buffer structure.

Figure 3:
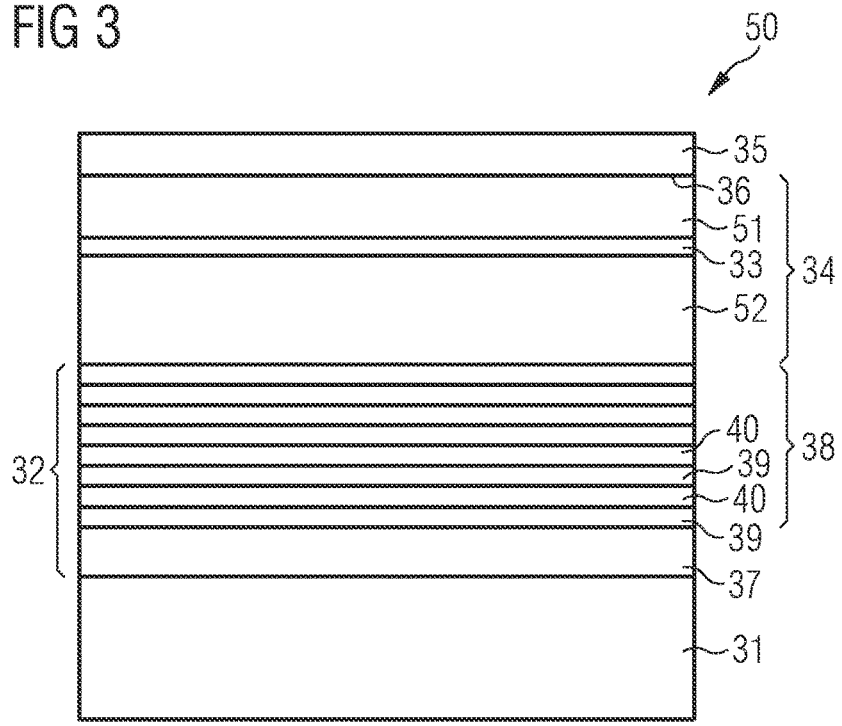
FIG. 3 illustrates a substrate structure according to a third embodiment.

FIG. 3 illustrates a buffer structure 50 according to a third embodiment. The buffer structure 50 includes a support substrate 31, a buffer structure 32 including an initially grown layer 37 and a superlattice laminate 38, a first Group III nitride layer 34 and a second Group III nitride layer 35 forming a heterojunction 36 as in the second embodiment. The substrate structure 50 also includes a blocking layer 33. In the third embodiment, the blocking layer 33 is, however, positioned within the unintentionally doped first Group III nitride layer 34, between two sublayers 51, 52 of the unintentionally doped first Group III nitride layer 34.

In this embodiment, the first sublayer 51 includes gallium nitride and is arranged between the superlattice laminate 38 and the unintentionally doped aluminium gallium nitride blocking layer 33. The second sublayer 52 includes gallium nitride and is arranged between the aluminium gallium nitride blocking layer 33 and the second Group III nitride layer 35 which also includes aluminium gallium nitride. The heterojunction 36 is formed at the interface between the second sublayer 52 of the first Group III nitride layer and the second Group III nitride layer 35. The blocking layer 33 may be considered as a delta back barrier and may have a composition of $Al_xGa_{(1-x)}N$ with $0.03 \leq x \leq 1$ and a thickness of $1\ nm \leq t \leq 30\ nm$ when positioned within the first Group III nitride layer 34.

The blocking layer 33 is not limited to a single layer and may include two or more sublayers which alternate with further sublayers of the first Group III nitride layer 34. An upper most sublayer of the first Group III nitride layer 34 forms the interface and heterojunction 36 with the second Group III nitride layer 35.

Figure 4:
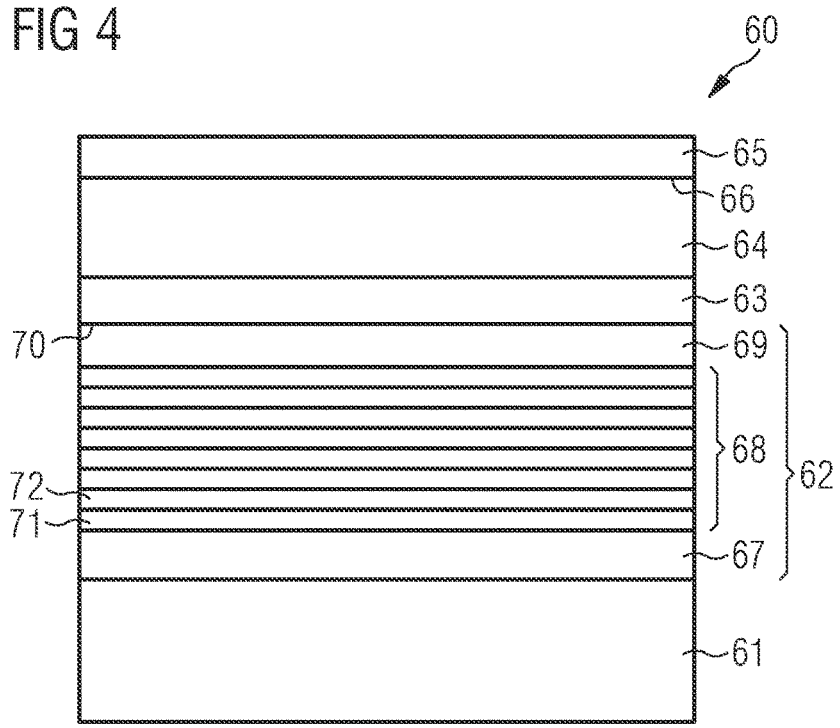
FIG. 4 illustrates a substrate structure according to a fourth embodiment.

FIG. 4 illustrates a schematic cross-sectional view of a substrate structure 60 according to a fourth embodiment. The substrate structure 60 includes a support substrate 61, a buffer structure 62 arranged on the support substrate 61, a blocking layer 63 arranged on the buffer structure 62, an unintentionally doped first Group III layer 64 arranged on the blocking layer 63 and a second unintentionally doped Group III nitride layer 65 arranged on the first unintentionally doped Group III nitride layer 64 and forming a heterojunction 66 therebetween.

In the fourth embodiment, the buffer structure 62 includes an initially grown AlN layer 67 arranged on the support substrate 61, an intentionally doped superlattice laminate 68 arranged on the initially grown layer 67 and an intentionally doped Group III nitride layer 69 arranged on the superlattice laminate 68. The intentionally doped Group III nitride layer 69 may include aluminium gallium nitride and the superlattice laminate 68 may include alternating sublayers 71, 72 of aluminium gallium nitride of differing aluminium content, for example $Al_{b1}Ga_{c1}N$ and $Al_{b2}G_{c2}N$, whereby $b_1 > b_2$ and $c_1 < c_2$ and $(b_1+c_1)=1$ and $(b_2+c_2)$ a such as AlN and $Al_{1-b2}Ga_{c2}N$, whereby $c_2 > 0$ Both the superlattice laminate 68 and the intentionally doped Group III nitride layer 69 have a doping concentration of at least $10^{18}\ cm^3$ and may be doped with carbon or iron. The combination of the intentionally doped Group III nitride layer 69 and the intentionally doped superlattice laminate 68 of the buffer structure 62 may be used to reduce vertical and lateral leakage currents if the substrate structure is used in a High Electron Mobility Transistor.

The blocking layer 63 is arranged at the interface 70 between the unintentionally doped first Group III nitride layer 64 and the buffer structure 62, in particular directly on the intentionally doped Group III nitride layer 69. The blocking layer 63 is unintentionally doped and has a larger bandgap than that of the unintentionally doped first Group III nitride layer 64. In some embodiments, the blocking layer 63 includes aluminium gallium nitride, for example $Al_xGa_{(1-x)}N$ with $0.03 \leq x \leq 0.5$ and a thickness of $200\ nm \leq t \leq 400\ nm$, the unintentionally doped first Group III nitride layer 64 includes gallium nitride and the unintentionally doped second Group III nitride layer 65 includes aluminium gallium nitride. The intentionally doped Group III nitride 69 may include gallium nitride or aluminium gallium nitride in embodiments in which it is positioned between the blocking layer 63 and the superlattice laminate 68.

The stack of Group III nitride layers is epitaxially grown on the support substrate 61 so that there is an epitaxial relationship between the orientation of the surface of the support substrate, in this embodiment <111> Si, and the wurzite crystal structure of the Group III nitride layers forming the initially grown layer 67, superlattice laminate 68, intentionally doped layer 69, blocking layer 63, first Group III nitride layer 64 and second Group III nitride layer 65.

FIG. 5 illustrates a substrate structure 80 according to a fifth embodiment. The substrate structure 80 includes the support substrate 61, the buffer structure 62 including the intentionally doped superlattice structure 68 and the intentionally doped layer 69, the blocking layer 63, the unintentionally doped first Group III nitride layer 64 and the unintentionally doped second Group III nitride layer 65 of the fourth embodiment.

In the substrate structure 80 according to the fifth embodiment, the blocking layer 63 is arranged between a first sublayer 81 and a second sublayer 82 of the unintentionally doped first Group III nitride layer 64. The blocking layer 63 is unintentionally doped and may include aluminium gallium nitride such that it has a larger bandgap than that of the gallium nitride of the first and second sublayers 81, 82 of the unintentionally doped first Group III nitride layer 64. The blocking layer 63 may have a composition and thickness which is different from that of the fourth embodiment due to its different position within the substrate structure 80. In the fifth embodiment, the blocking layer 63 may include a greater aluminium content and a smaller thickness, for example $Al_xGa_{(1-x)}N$ with $0.03 \leq x \leq 1$ and a thickness of $1\ nm \leq t \leq 30\ nm$.

The buffer structure 62 includes the intentionally doped Group III nitride layer 69 and intentionally doped superlattice structure 68 as in the fourth embodiment. The first sublayer 81 of the first Group III nitride layer 64 is arranged in direct contact with the intentionally doped Group III nitride layer 69.

The blocking layer 63 is not limited to a single layer and may include two or more sublayers which alternate with further sublayers of the first Group III nitride layer 64. An upper most sublayer of the first Group III nitride layer 64 forms the interface and heterojunction 66 with the second Group III nitride layer 65.

FIG. 6 illustrates a substrate structure 90 according to a sixth embodiment. The substrate structure 90 includes a support substrate 91, a buffer structure 92 arranged on the support substrate 91, a blocking layer 93 arranged on the buffer structure 92, an intentionally doped layer 94 arranged on the blocking layer 93, a first unintentionally doped Group III nitride layer 95 arranged on the intentionally doped layer 94 and a second unintentionally doped Group III nitride layer 96 arranged on the first unintentionally doped Group III nitride layer 95 and forming a heterojunction 97 at the interface between the first and second unintentionally doped Group III nitride layers 95, 96. The first unintentionally doped Group III nitride layer 95 and the second unintentionally doped Group III nitride layer 96 form the active portion of the substrate structure 90. The heterojunction 97 may support a two dimensional electron gas (2DEG) or a two dimensional hole gas (2DHG) in embodiments in which the active portion of the substrate structure 90 provides a HEMT.

The support substrate 91 includes a single crystal wafer which is capable of supporting the epitaxial growth of the overlying Group III nitride layers. In the embodiment illustrated in FIG. 6, the support substrate 91 includes a single silicon wafer having a <111> orientation. The buffer structure 92 includes an initially grown layer 98 which is epitaxially grown on the support substrate 91 and a superlattice laminate 99 which is epitaxially grown on the initially grown layer 98. In this embodiment, the initially grown layer 98 includes aluminium nitride and the superlattice laminate 99 includes alternating layers 101, 102 of AlN and AlGaN. The initially grown layer 98 may be intentionally doped or unintentionally doped and may include two or more sublayers of differing composition. The superlattice laminate 99 is intentionally doped and may be doped with carbon or iron. In one particular embodiment, the superlattice laminate 99 is carbon doped and includes a carbon concentration of at least $10^{18}/cm^3$.

The blocking layer 93 is, in the sixth embodiment, intentionally doped and may be doped with carbon or iron. In one particular embodiment, the intentionally doped blocking layer 93 includes a carbon concentration of at least $10^{18}/cm^3$. The intentionally doped layer 94 includes a Group III nitride and may be doped with carbon or iron. In one embodiment, the intentionally doped layer 94 is carbon doped and has a carbon concentration of at least $10^{18}/cm^3$. The blocking layer 93 is arranged between the intentionally doped layer 94 and the superlattice laminate 99. The blocking layer 93 is arranged in the stack between the heterojunction 97 and the buffer structure 92 and in particular between the heterojunction 97 and the superlattice laminate 99.

The intentionally doped blocking layer 93 has a larger bandgap than the intentionally doped layer 94. In one embodiment, the intentionally doped blocking layer 93 includes aluminium gallium nitride and the intentionally doped layer 94 includes a Group III nitride material with a smaller bandgap and may include gallium nitride. The intentionally doped blocking layer 93 may have a composition of $Al_xGa_{(1-x)}N$ with $0.03 \leq x \leq 0.5$ and a thickness of 200 nm t<400 nm. The intentionally doped blocking layer 93 may also be considered as a back barrier layer.

FIG. 7 illustrates a substrate structure 110 according to a seventh embodiment. The substrate structure 110 also includes the support substrate 91, the buffer structure 92 including the initially grown layer 98, intentionally doped superlattice structure 99 including alternating layers 100, 101 of AlN and AlGaN and the intentionally doped layer 94 arranged on the superlattice structure 99. The substrate structure 110 also includes the first unintentionally doped Group III nitride layer 95 and the second unintentionally doped Group III nitride layer 96 forming heterojunction 97 therebetween as in the sixth embodiment.

The superlattice structure 99 is not limited to one including alternating layers 100, 101 of AlN and AlGaN, but may include subgroups of three or more layers of differing composition, such as $Al_xGa_{1-x}N$ of varying aluminium content x, in order to provide a bandgap which periodically varies in a vertical direction within the superlattice structure 99.

The substrate structure 110 also includes a blocking layer 93 which is intentionally doped. In the seventh embodiment, the intentionally doped blocking layer 93 is arranged in a different position in the stack and is arranged within the intentionally doped layer 94, between a first sublayer 111 and a second sublayer 112 of the intentionally doped layer 94.

The first and second sublayers 111, 112 of the intentionally doped layer 94 include a Group III nitride and may include gallium nitride. The blocking layer 93 includes a larger bandgap than that of the first sublayer 111 and the second sublayer 112 of the intentionally doped layer 94. The blocking layer 93 may include aluminium gallium nitride, for example $Al_xGa_{(1-x)}N$ with $0.03 \leq x \leq 1$ and a thickness of 1 nm$\leq t \leq$30 nm if the first sublayer 111 and the second sublayer 112 include gallium nitride. Both the blocking layer 93 and the first sublayer and second sublayer 111, 112 of the intentionally doped layer 94 may be intentionally doped with carbon or iron and, in one embodiment, have a carbon concentration of at least $10^{18}/cm^3$.

FIG. 8 illustrates a substrate structure 120 according to an eighth embodiment.

The substrate structure 120 includes a support substrate 121, a buffer structure 122 arranged on the support substrate 121, a first Group III nitride layer 123 arranged on the buffer structure 122 and a second Group III nitride layer 124 arranged on the first Group III nitride layer 123. A heterojunction 125 is formed between the first Group III nitride layer 123 and the second Group III nitride layer 124 due to the different composition and differing bandgap of these layers. The first Group III nitride layer 123 may include gallium nitride and a second Group III nitride layer 124 may include aluminium gallium nitride.

The support substrate 121 may include a single crystal substrate capable of supporting the epitaxial growth of Group III nitride layers. In one embodiment, the support substrate 121 includes a single crystal silicon wafer having a <111> orientation. The buffer structure 122 may include an initially grown layer 126 epitaxially deposited on a first surface 127 of the support substrate 121. The buffer structure 122 further includes a superlattice laminate 128 which is epitaxially built up on the initially grown layer 126. The superlattice laminate 128 includes alternating layers 129, 130 of $Al_{b1}Ga_{c1}N$ and $Al_{b2}G_{c2}N$, whereby $b_1 > b_2$ and $c_1 < c_2$ and $(b_1+c_1)=1$ and $(b_2+c_2)=1$. For example, the layers 129 may include $Al_{b2}Ga_{c2}N$, whereby $0<b_2<1$, $0<c_2<1$ and $(b_2+c_2)=1$ and have a thickness of 5 nm to 30 nm and the layers 130 may include AlN and have a thickness of 1 nm to 15 nm.

The superlattice laminate 128 is intentionally doped with either carbon or iron. One particular embodiment, the superlattice laminate 128 is carbon-doped and has a carbon concentration of at least $10^{18}/cm^3$. In contrast, the first Group III nitride layer 123, which is epitaxially grown on the superlattice layer 128, and the second Group III nitride layer 124, which is epitaxially grown on the first Group III nitride layer 123, are not intentionally doped and, therefore, include a dopant concentration of less than $10^{18}/cm^3$.

In the substrate structure according to the eighth embodiment, all of the Group III nitride layers apart from the superlattice laminate 128 are unintentionally doped and have a dopant concentration which is less than $10^{18}/cm^3$ or less than $10^{16}/cm^3$. In some embodiments, the initially grown layer 126 is doped and the remainder of the Group III nitride layers apart from the superlattice laminate 128 are unintentionally doped and have a dopant concentration which is less than $10^{18}/cm^3$ or less than $10^{16}/cm^3$.

The substrate structure according to any of the embodiments described herein may be used to form various semiconductor devices. In one embodiment, a substrate structures according to one of the embodiments described herein may be used as part of a transistor device and in one particular embodiment, as part of a High Electron Mobility Transistor (HEMT) device.

Figure 9:
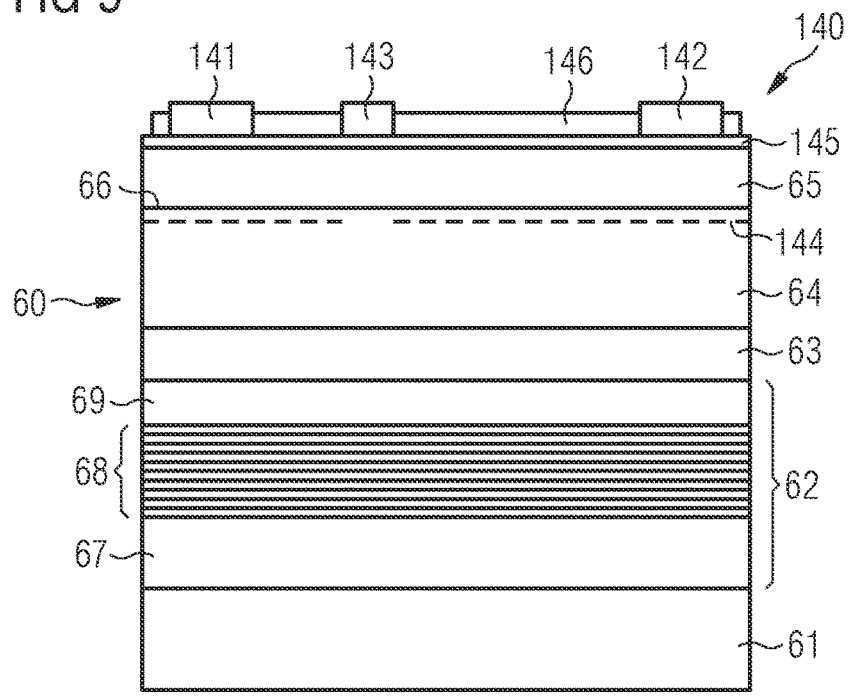
FIG. 9 illustrates a transistor device including a substrate structure.

FIG. 9 illustrates an example of a High Electron Mobility Transistor device 140 including the substrate structure 60 of FIG. 4.

The High Electron Mobility Transistor device 140 includes a source 141, a drain 142 and a gate 143 arranged on the second Group III nitride layer 65. The gate 143 is arranged laterally between the source 141 and the drain 142. A two-dimensional electron gas (2DEG) is formed at the interface 66 between the first group III nitride layer 64 and the second Group III nitride layer 65 and is schematically indicated in FIG. 9 with the dashed line 144. The first Group III nitride layer 64 is unintentionally doped and includes gallium nitride. The first Group III nitride layer 64 provides the channel layer of the High Electron Mobility Transistor device 140. The second Group III nitride layer 65 is unintentionally doped and may include aluminium gallium nitride. The second Group III nitride layer 65 provides the barrier layer of the High Electron Mobility Transistor device 140.

The High Electron Mobility Transistor device 140 may include further layers deposited onto the second Group III nitride layer 65. For example, the High Electron Mobility Transistor device 140 may include a gallium nitride cap layer 145, one or more passivation layers, for example $SiN_x$, and/or one or more dielectric isolation layers 146, for example $SiO_x$.

In some embodiments, the High Electron Mobility Transistor device 140 may also include a gate insulation layer arranged between the gate 143 and the second Group III nitride layer 65. The High Electron Mobility Transistor device 140 may also include a p-doped gallium nitride layer arranged between the gate 143 and the second Group III nitride layer 65 and/or a recessed gate structure. The High Electron Mobility Transistor device 140 may include a cap layer 145 and/or a gate insulation layer and/or a p-doped gallium nitride layer and/or a recessed gate structure.

The High Electron Mobility Transistor device 140 may be a depletion mode device or an enhancement mode device. The High Electron Mobility Transistor device 140 may be a high-voltage device with a blocking voltage capability of at least 300V or at least 600V.

The buffer structure 62 includes an intentionally doped superlattice laminate 68 and a further intentionally doped layer 69. The blocking layer 63 is arranged between the intentionally doped layers 68, 69 of the buffer structure 62 and the heterojunction 66 supporting the two dimensional electron gas (2DEG) within the active portion of the High Electron Mobility Transistor device 140. In this particular embodiment, the blocking layer 63 is arranged directly on the intentionally doped layer 69.

Figure 10:
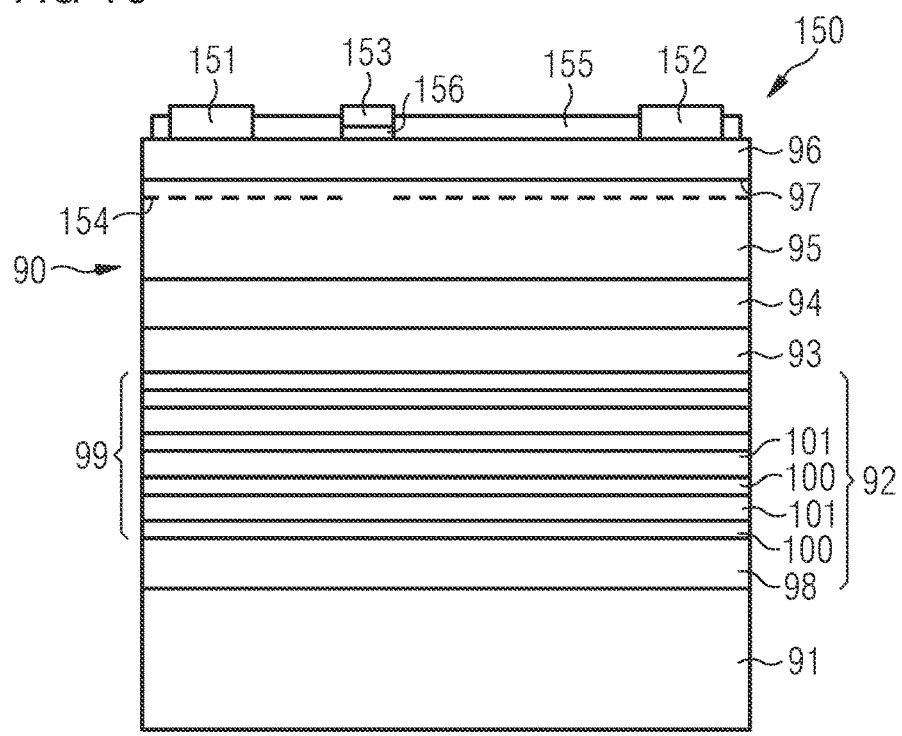
FIG. 10 illustrates a transistor device including a substrate structure.

FIG. 10 illustrates an example of a High Electron Mobility Transistor device 150 including the substrate structure 90 of FIG. 6.

The High Electron Mobility Transistor device 150 includes a source 151, a drain 152 and a gate 153 arranged on the second Group III nitride layer 96. The gate 153 is arranged laterally between the source 151 and the drain 152. A two-dimensional electron gas (2DEG) is formed at the interface 97 between the first group III nitride layer 95 and the second Group III nitride layer 96 and is schematically indicated in FIG. 10 with the dashed line 154. The first group III nitride layer 95 and the second Group III nitride layer 96 form the active portion of the High Electron Mobility Transistor device 150.

The first Group III nitride layer 95 is unintentionally doped and includes gallium nitride. The first Group III nitride layer 95 provides the channel layer of the High Electron Mobility Transistor device 150. The second Group III nitride layer 96 is unintentionally doped and includes aluminium gallium nitride. The second Group III nitride layer 96 provides the barrier layer of the High Electron Mobility Transistor device 150.

The High Electron Mobility Transistor device 150 may include further layers deposited onto the second Group III nitride layer 96. For example, the High Electron Mobility Transistor device 150 may include a gallium nitride cap layer, one or more passivation layers, for example $SiN_x$, and/or one or more dielectric isolation layers 155, for example $SiO_x$.

The High Electron Mobility Transistor device 150 may be a depletion mode device or an enhancement mode device. The High Electron Mobility Transistor device 150 may be a high-voltage device with a blocking voltage capability of at least 300V or at least 600V.

The High Electron Mobility Transistor device 150 may include a p-doped gallium nitride layer 156 arranged between the gate 153 and the second Group III nitride layer 96 and/or a recessed gate structure to provide an enhancement mode device. In some embodiments, High Electron Mobility Transistor device 150 may include a gate insulation layer arranged between the gate 153 and the second Group III nitride layer 96, The buffer structure 92 of the substrate structure 90 includes an initially grown layer 98 on the support substrate 91 and an intentionally doped superlattice laminate 99. The blocking layer 93 is intentionally doped and arranged directly on the superlattice laminate 99. An intentionally doped Group III nitride layer 94 is arranged between the blocking layer 93 and the first unintentionally doped Group III nitride layer 95. The blocking layer 93 is arranged in the stack between the heterojunction 97 and the buffer structure 92 and in particular between the heterojunction 97 and the superlattice laminate 99.

The intentionally doped blocking layer 93 and the intentionally doped layer 94 may include a carbon concentration of at least $10^{18}/cm^3$. The intentionally doped blocking layer 93 has a larger bandgap than the intentionally doped layer 94. The intentionally doped layer 94 may include gallium nitride and the intentionally doped blocking layer 93 may include aluminium gallium nitride. The intentionally doped blocking layer 93 may be considered as a back barrier layer.

GaN based semiconductor devices, such as HEMTs, provide unique performance figure of merits due to the material properties. The use of Si substrate wafers, which at present are less expensive, may be used to reduce the cost of the device and provide good performance. Due to the lattice and temperature coefficient mismatch between the Si substrate and the III-nitride semiconductor layers of the device, buffer layers are introduced before the GaN deposition to enable high quality epitaxial GaN semiconductors on Si substrates.

The GaN/AlGaN deposition is not, however, defect free or is always slightly doped due to lattice imperfection. This low doping level may lead to the formation of leakage currents in the HEMT device in vertical as well as lateral direction. To compensate for these leakage currents, C-doping of Group III nitrides, such as the layer 69 and superlattice 68 of the buffer structure 62, may be used. With the C-doping, the unintended defects can be compensated and the leakage currents reduced.

However, C-doping may also introduce trap centers which are responsible for the so called dynamic $R_{DSON}$ effect, current collapse and threshold voltage shifts. A blocking layer or back barrier is introduced into the stack to limit the access of the electrons to enter the C-doped portion of the buffer structure, for example the superlattice laminate in the embodiments illustrated in FIGS. 1 to 5. The blocking layer prevents the electrons from entering the C-doped region and therefore suppresses the C-doped induced dynamic $R_{DSON}$ effects.

At the interface between the superlattice laminate and the GaN channel layer of the HEMT, so called dislocation bending in lateral or diagonal directions can occur. This dislocation bending may lead to lateral leakage paths. Even if the dislocations can be partially compensated by C-doping of at least portions of the buffer structure, there is still the risk that these defects/traps can be activated during device operations and therefore could affect the dynamic $R_{DSON}$ behavior. The blocking layer can also be integrated within the C-doped region to hinder the free carriers from activating/deactivating the dislocation introduced defects or traps as in the embodiment illustrated in FIGS. 6 and 7. With this approach at least the dislocation induced traps at the interface region between the superlattice and the blocking layer are shielded and only the trap level of the C-doping is responsible for the dynamic $R_{DSON}$ effect without contributions of the bent dislocations.

To summarise, the use of blocking layers and doping concepts are introduced within a substrate structure of a transistor device, such as a HEMT, which includes an intentionally doped superlattice and unintentionally doped Group III nitride-based active layers, to reduce the dynamic $R_{DSON}$ response initiated by the C-doped buffer structure. Either the blocking layer may be inserted such that it shields the C-doped buffer region above the superlattice or the doped buffer is omitted and the blocking layer prohibits the access to the dislocations. Even with a C-doped buffer structure, the blocking layer can shield the traps/defects introduced by dislocation bending by avoiding the penetration of the carriers into the damaged crystal region.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming an intentionally doped superlattice laminate on a support substrate;
   forming a Group III nitride-based device comprising a heterojunction on the superlattice laminate layer; and
   forming a charge blocking layer between the heterojunction and the superlattice laminate.

2. The method of claim 1, further comprising:
   forming an intentionally doped leakage current reduction layer on the superlattice laminate layer, the intentionally doped leakage current reduction layer comprising leakage current compensating dopants and charge trap centres,
   wherein the charge blocking layer is formed between the heterojunction and the intentionally doped leakage current reduction layer.

3. The method of claim 1, further comprising:
   doping the superlattice laminate to a dopant concentration of at least $10^{18}/cm^3$.

4. The method of claim 3, wherein the superlattice laminate is doped with carbon, wherein the carbon concentration is at least $10^{18}/cm^3$.

5. The method of claim 1, wherein forming the superlattice laminate comprises:
   forming alternate first layers and second layers,
   wherein the first layers comprise $B_{a1}Al_{b1}Ga_{c1}In_{d1}N$ material,
   wherein $0 \le a_1 \le 1$, $0 \le b_1 \le 1$, $0 \le c_1 \le 1$, $0 \le d_1 \le 1$ and $(a_1+b_1+c_1+d_2)=1$,
   wherein the second layers comprise $B_{a2}Al_{b2}Ga_{c2}In_{d2}N$ material,
   wherein $0 \le a_2 \le 1$, $0 \le b_2 \le 1$, $0 \le c_2 \le 1$, $0 \le d_2 \le 1$ and $(a_2+b_2+c_2+d_2)=1$,
   wherein the band gap of the second layer material is different from that of the first layer material.

6. The method of claim 5, wherein the superlattice laminate is doped with carbon at a carbon concentration of at least $10^{18}/cm^3$.

7. A method, comprising:
   forming a buffer structure on a support substrate, the buffer structure comprising an intentionally doped superlattice laminate;
   forming an unintentionally doped first Group III nitride layer on the buffer structure;
   forming a second Group III nitride layer on the first Group III nitride layer to form a heterojunction therebetween;
   forming a source, a drain and a gate on the second Group III nitride layer; and
   forming a blocking layer between the heterojunction and the buffer structure, the blocking layer being configured to block charges from entering the buffer structure.

8. The method of claim 7, wherein forming the buffer structure comprises:
   forming an intentionally doped Group III nitride layer on the superlattice laminate,
   wherein the unintentionally doped Group III nitride layer and the superlattice laminate are doped with carbon and have a carbon concentration of at least $10^{18}/cm^3$,
   wherein the blocking layer comprises unintentionally doped $Al_xGa_{(1-x)}N$, wherein the aluminium content x is greater than an aluminium content of the first Group III nitride layer, wherein the blocking layer is arranged between the first Group III nitride layer and the intentionally doped Group III nitride layer.

9. The method of claim 7, wherein forming the buffer structure comprises:
forming an intentionally doped Group III nitride layer between the superlattice laminate and the unintentionally doped Group III nitride layer,
wherein the blocking layer is arranged between the superlattice laminate and the unintentionally doped Group III nitride layer and comprises an intentionally doped Group III nitride having a larger band gap than that of the unintentionally doped Group III nitride layer,
wherein the unintentionally doped Group III nitride layer, the intentionally doped Group III nitride blocking layer and the superlattice laminate comprise a carbon dopant and a carbon concentration of at least $10^{18}/cm^3$.

10. A method, comprising:
forming a buffer structure on a support substrate, the buffer structure comprising an intentionally doped superlattice laminate;
forming an unintentionally doped first Group III nitride layer on the buffer structure;
forming a second Group III nitride layer on the first Group III nitride layer to form a heterojunction therebetween; and
forming a blocking layer between the heterojunction and the buffer structure, the blocking layer being configured to block charges from entering the buffer structure.

11. The method of claim 10, wherein forming the buffer structure comprises:
forming alternate first layers and second layers of the superlattice laminate,
wherein the first layers comprise $B_{a1}Al_{b1}Ga_{c1}In_{d1}N$ material,
wherein $0 \leq a_1 \leq 1$, $0 \leq b_1 \leq 1$, $0 \leq c_1 \leq 1$, $0 \leq d_1 \leq 1$ and $(a_1+b_1+c_1+d_2)=1$,
wherein the second layers comprise $B_{a2}Al_{b2}Ga_{c2}In_{d2}N$ material,
wherein $0 \leq a_2 \leq 1$, $0 \leq b_2 \leq 1$, $0 \leq c_2 \leq 1$, $0 \leq d_2 \leq 1$ and $(a_2+b_2+c_2+d_2)=1$,
wherein the band gap of the second layer material is different from that of the first layer material and the superlattice laminate is doped with carbon and comprises a carbon concentration of at least $10^{18}/cm^3$.

12. The method of claim 10, wherein forming the blocking layer comprises:
forming unintentionally doped $Al_xGa_{(1-x)}N$ having an aluminium content x greater than an aluminium content of the first Group III nitride layer.

13. The method of claim 12, wherein the blocking layer is formed between the superlattice laminate and the first Group III nitride layer.

14. The method of claim 12, wherein the blocking layer is formed between a first sublayer of the first Group III nitride layer and a second sublayer of the first Group III nitride layer, the first sublayer being arranged on the superlattice laminate.

15. The method of claim 10, wherein forming the buffer structure comprises:
forming an intentionally doped Group III nitride layer on the superlattice laminate,
wherein the blocking layer is unintentionally doped.

16. The method of claim 15, wherein the intentionally-doped Group III nitride layer is doped with carbon and has a carbon concentration of at least $10^{18}/cm^3$.

17. The method of claim 16, wherein the blocking layer comprises unintentionally doped $Al_xGa_{(1-x)}N$ having an aluminium content x greater than an aluminium content of the first Group III nitride layer.

18. The method of claim 17, wherein the blocking layer is arranged between the first Group III nitride layer and the intentionally doped Group III nitride layer.

19. The method of claim 16, wherein the blocking layer is arranged between a first sublayer of the first Group III nitride layer arranged on the carbon-doped Group III nitride layer and a second sublayer of the first Group III nitride layer.

20. The method of claim 10, wherein forming the buffer structure comprises:
forming an intentionally doped Group III nitride layer between the superlattice laminate and the first Group III nitride layer,
wherein the blocking layer comprises an intentionally doped Group III nitride blocking layer having a larger band gap than that of the intentionally doped Group III nitride layer.

* * * * *